US011119977B2

(12) United States Patent
Seshadri et al.

(10) Patent No.: US 11,119,977 B2
(45) Date of Patent: Sep. 14, 2021

(54) COGNITIVE COMPRESSION WITH VARYING STRUCTURAL GRANULARITIES IN NOSQL DATABASES

(71) Applicant: INTERNATIONAL BUSINESS MACHINES CORPORATION, Armonk, NY (US)

(72) Inventors: Sangeetha Seshadri, Santa Clara, CA (US); Mohit Saxena, San Jose, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 105 days.

(21) Appl. No.: 16/402,039

(22) Filed: May 2, 2019

(65) Prior Publication Data

US 2020/0349108 A1  Nov. 5, 2020

(51) Int. Cl.
*G06N 20/00* (2019.01)
*H03M 7/30* (2006.01)
*G06F 16/11* (2019.01)
*G06F 16/17* (2019.01)
*G06N 5/02* (2006.01)
*G06K 9/62* (2006.01)

(52) U.S. Cl.
CPC ........ *G06F 16/122* (2019.01); *G06F 16/1727* (2019.01); *G06K 9/6257* (2013.01); *G06N 5/025* (2013.01); *G06N 20/00* (2019.01); *H03M 7/30* (2013.01)

(58) Field of Classification Search
CPC ......... G06F 16/122; G06N 20/00; H03M 7/30

USPC ........................................................ 707/694
See application file for complete search history.

(56) References Cited

U.S. PATENT DOCUMENTS

| 7,930,436 | B1 | 4/2011 | Znosko |
| 8,806,062 | B1 | 8/2014 | Vertongen et al. |
| 9,235,590 | B1 | 1/2016 | Wang et al. |
| 2001/0031633 | A1 | 10/2001 | Tuomela et al. |
| 2002/0087704 | A1 | 7/2002 | Chesnais et al. |
| 2004/0254998 | A1 | 12/2004 | Horvitz et al. |
| 2008/0154986 | A1 | 6/2008 | Kavuri et al. |
| 2009/0313275 | A1* | 12/2009 | Gehman ............... G06F 16/221 |

(Continued)

OTHER PUBLICATIONS

"Personalized and Situation-Aware Multimodal Route Recommendations: The FAVOUR Algorithm", Paolo Campigotto, Christian Rudloff, Maximilian Leodolter, and Dietmar Bauer. IEEE Transactions on Intelligent Transportation Systems, vol. 18, No. 1, Jan. 2017 (11 Pages).

(Continued)

*Primary Examiner* — Robert W Beausoliel, Jr.
*Assistant Examiner* — Pedro J Santos
(74) *Attorney, Agent, or Firm* — Griffiths & Seaton PLLC

(57) ABSTRACT

Cognitive compression with varying structural granularities in a NoSQL database by establishing a data training set for compressing and decompressing data stored within the NoSQL database. The data training set includes received user policy goals, compression parameters, and metered feedback associated with data usage and workload characteristics. A compression parameter model is dynamically implemented in real-time for the data selected according to the established data training set to compress and decompress the data at a given structural granularity.

21 Claims, 11 Drawing Sheets

(56) References Cited

U.S. PATENT DOCUMENTS

2012/0078978 A1    3/2012  Shoolman et al.
2014/0181085 A1*  6/2014  Gokhale ............... G06F 16/168
                                                      707/722

OTHER PUBLICATIONS

"Adaptive On-the-Fly Compression", Chandra Krintz and Sezgin Sucu. IEEE Transactions on Parallel and Distributed Systems, vol. 17, No. 1, Jan. 2006 (10 Pages).
"A Machine Learning Perspective on Predictive Coding with PAQ8 and New Applications" Byron Knoll, B. Sc. Computer Science, The University of British Columbia, Jun. 2011 (45 Pages).

* cited by examiner

COGNITIVE COMPRESSION WITH VARYING STRUCTURAL GRANULARITIES IN NOSQL DATABASES

BACKGROUND OF THE INVENTION

Field of the Invention

The present invention relates in general computing systems, and more particularly to, various embodiments for cognitive compression of data within and/or between distributed computing components.

Description of the Related Art

NoSQL (originally referring to "non SQL" or "non-relational") databases provide a mechanism for storage and retrieval of data that is modeled in means other than the tabular relations used in relational databases. Motivations for this approach include: simplicity of design, simpler "horizontal" scaling to clusters of machines, which is a problem for relational databases, and finer control over availability. The data structures used by NoSQL databases (e.g. key-value, graph, or document) differ slightly from those used by default in relational databases, making some operations faster in NoSQL and others faster in relational databases. NoSQL databases are increasingly used in big data and real-time web applications.

SUMMARY OF THE INVENTION

Various embodiments for cognitive compression with varying structural granularities in a NoSQL database, by a processor are provided. In one embodiment, by way of example only, a method comprises establishing a data training set for compressing and decompressing data stored within the NoSQL database; wherein the data training set includes received user policy goals, compression parameters, and metered feedback associated with data usage and workload characteristics; and dynamically implementing a compression parameter model in real-time for the data selected according to the established data training set to compress and decompress the data at a given structural granularity.

In addition to the foregoing exemplary embodiment, various other system and computer program product embodiments are provided and supply related advantages. The foregoing summary has been provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE DRAWINGS

Figure 1:
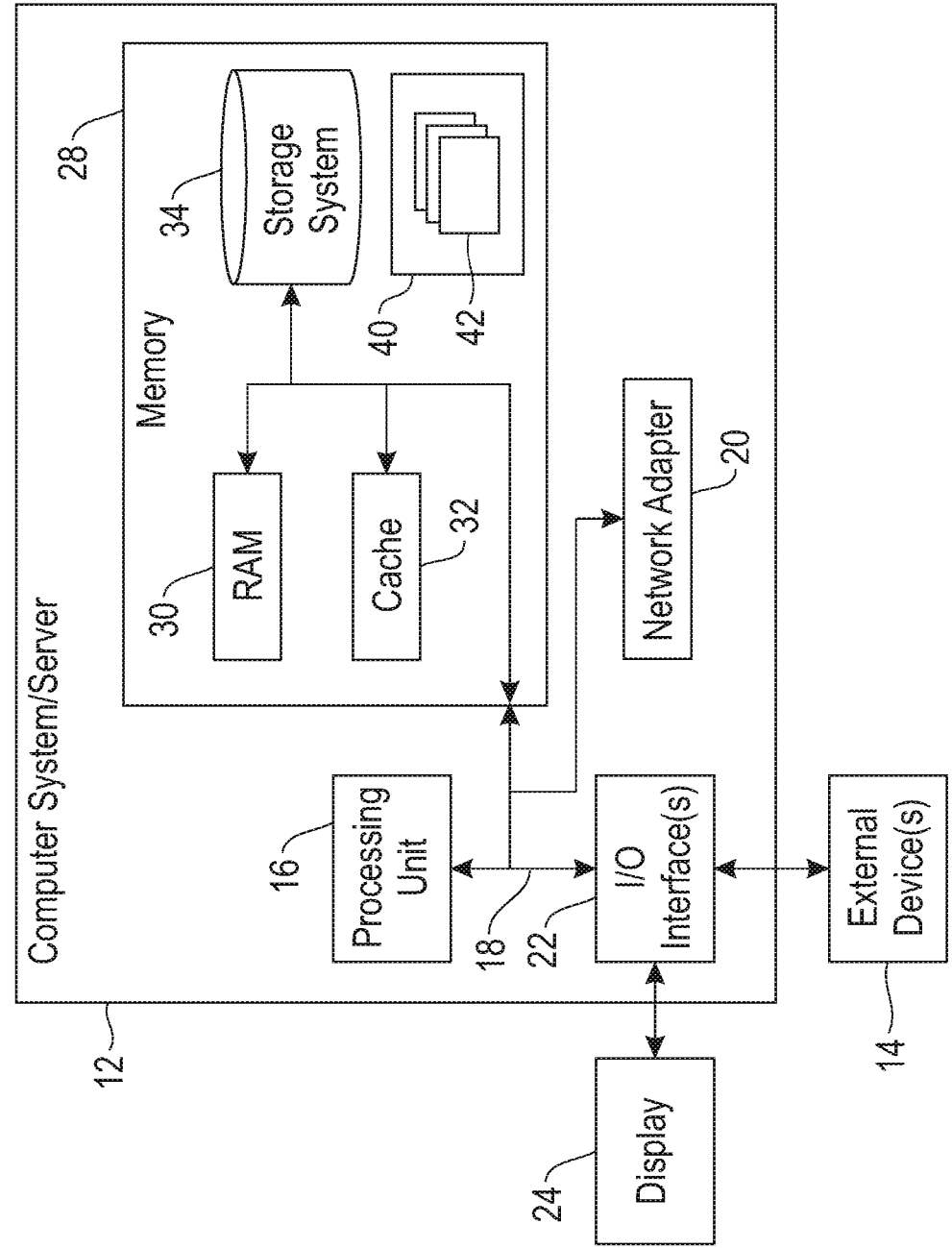
FIG. 1 is a block diagram depicting an exemplary cloud computing node, according to an embodiment of the present invention.

As previously mentioned, NoSQL databases provide a mechanism for storage and retrieval of data that is modeled in means other than the tabular relations used in relational databases. Motivations for this approach include: simplicity of design, simpler "horizontal" scaling to clusters of machines, which is a problem for relational databases, and finer control over availability. The data structures used by NoSQL databases (e.g. key-value, graph, or document) differ slightly from those used by default in relational databases, making some operations faster in NoSQL and others faster in relational databases. NoSQL databases are increasingly used in big data and real-time web applications.

Compression in NoSQL database provides capacity savings and performance advantages. These performance advantages and capacity savings can ultimately result in real benefits from reducing resource acquisition and storage costs for more expensive types of hardware (e.g., flash or solid state storage); improving input/output (I/O) path performance; providing support for large key-value records (e.g., records having a size on the order of Megabytes); requiring fewer data copies between software, operating system (OS), and device layers; providing more efficient read/write alignment with device pages (e.g., when paired with some types of non-volatile memory (NVM) or solid state storage devices); and providing faster recovery and shard migration of compressed data over various networks.

However, most commercial NoSQL databases rely on a particular compression mechanism that is configured statically and applied at a particular structural granularity. For example, the keys and values are compressed using prefix compression or Huffman encoding, or the storage blocks are compressed using a compression library. Notwithstanding, in actual database implementations, it has been observed that there are many more structural granularities other than keys, values, and blocks. Similarly, there are different data and workload characteristics that can be used to estimate and manage the capacity savings and performance improvements that result in the compression and decompression I/O path. This is notable, because the statically defined compression models lack any goal-oriented compression functionality, in that these mechanisms are unaware of the underlying workload and data characteristics being compressed (e.g., rates of data arrival into the compression system, required and/or user specified performance and capacity properties, etc.), nor are these compression models able to self-configure so as to utilize the workload and data characteristics to implement differing compression models which are selected as being the most suitable for the given data or workload at runtime.

Accordingly, the mechanisms of the present invention disclose functionality which implements a cognitive compression system which is self-configuring and learning at runtime (i.e., able to be dynamically implemented in real-time as the workload is processed into the compression system). This cognitive compression system uses various compression parameters to enable a selection of compression (and decompression) of data at different structural granularities (e.g., batch, sub-batch, or individual record sizes), using different points of compression (e.g., inline or background compression), at a given compression timing (e.g., synchronously or asynchronously). The cognitive compression system disclosed herein further considers, when selecting the most suitable compression model to enable for the given data, policy service level agreements (SLAs) specified by users which define goals according to storage performance and capacity, and generates continuous feedback to learn and iterate compression parameters based on system input. Some non-limiting parameters, for example, may comprise monitored metrics, data arrival and data access rates, a compression ratio (i.e., a ratio of the uncompressed size to the compressed size of the data), read/write amplification, resource utilization (e.g., processor, memory, and/or storage utilization), and I/O response times.

Following will be discussed different approaches and granularities at which this disclosure focuses on while applying these compression models cognitively, based on the feedback from the workload, data characteristics, and the performance and storage capacity savings. Moreover, different heuristics designed to select the compression mechanism and structural granularity dynamically at runtime will be disclosed. It should be noted that the functionality considered herein has been implemented and evaluated in TOAD (a NoSQL database, storage engine), and hence the techniques discussed in that context. Notwithstanding, the disclosed techniques are generic and applicable to other commercial NoSQL databases such as MongoDB™, RocksDB, and LevelDB.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via I/O interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, redundant array of independent disks (RAID) systems, tape drives, and data archival storage systems, etc.

Figure 2:
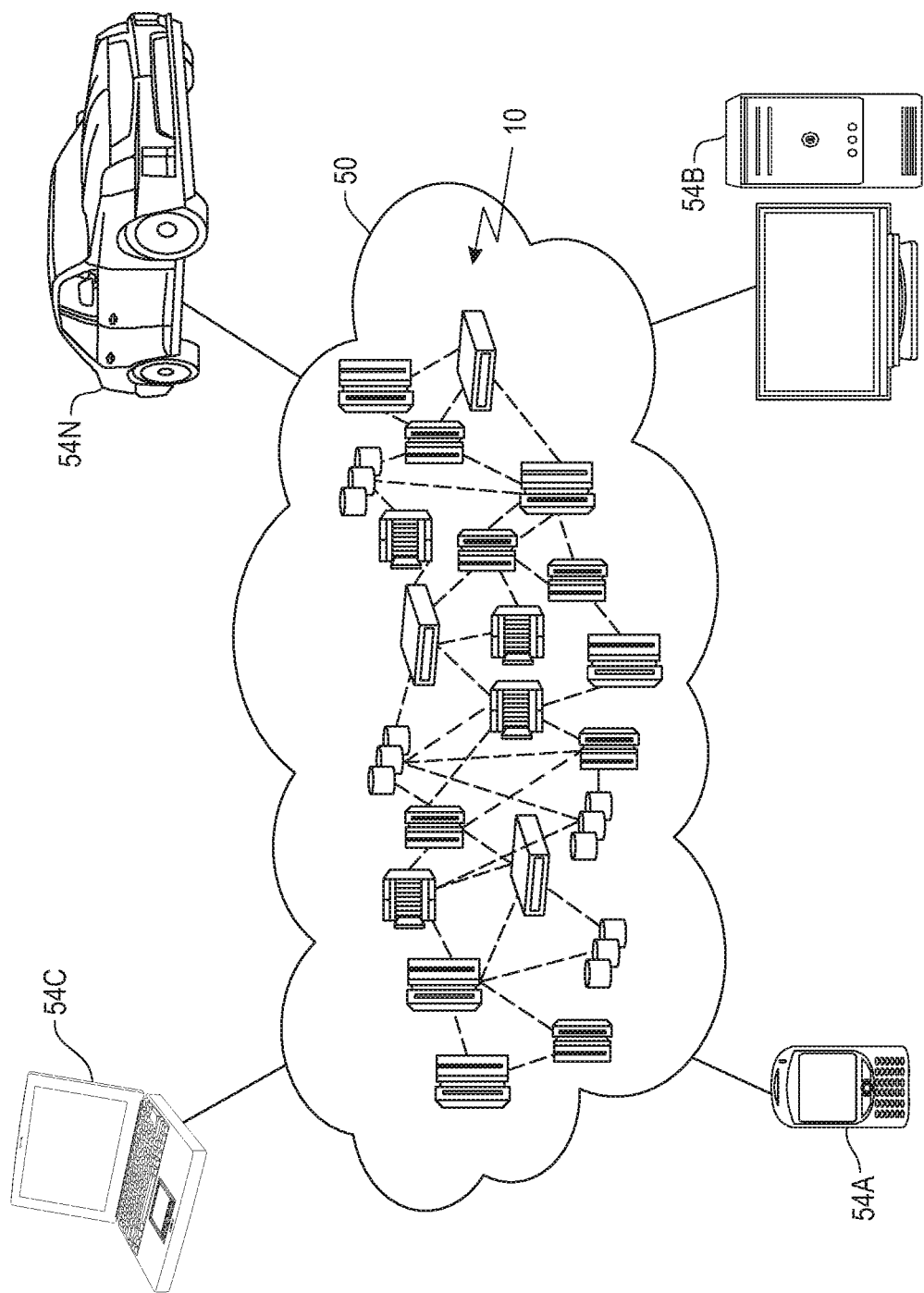
FIG. 2 is a block diagram depicting an exemplary cloud computing environment, according to an embodiment of the present invention.

Referring now to FIG. 2, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
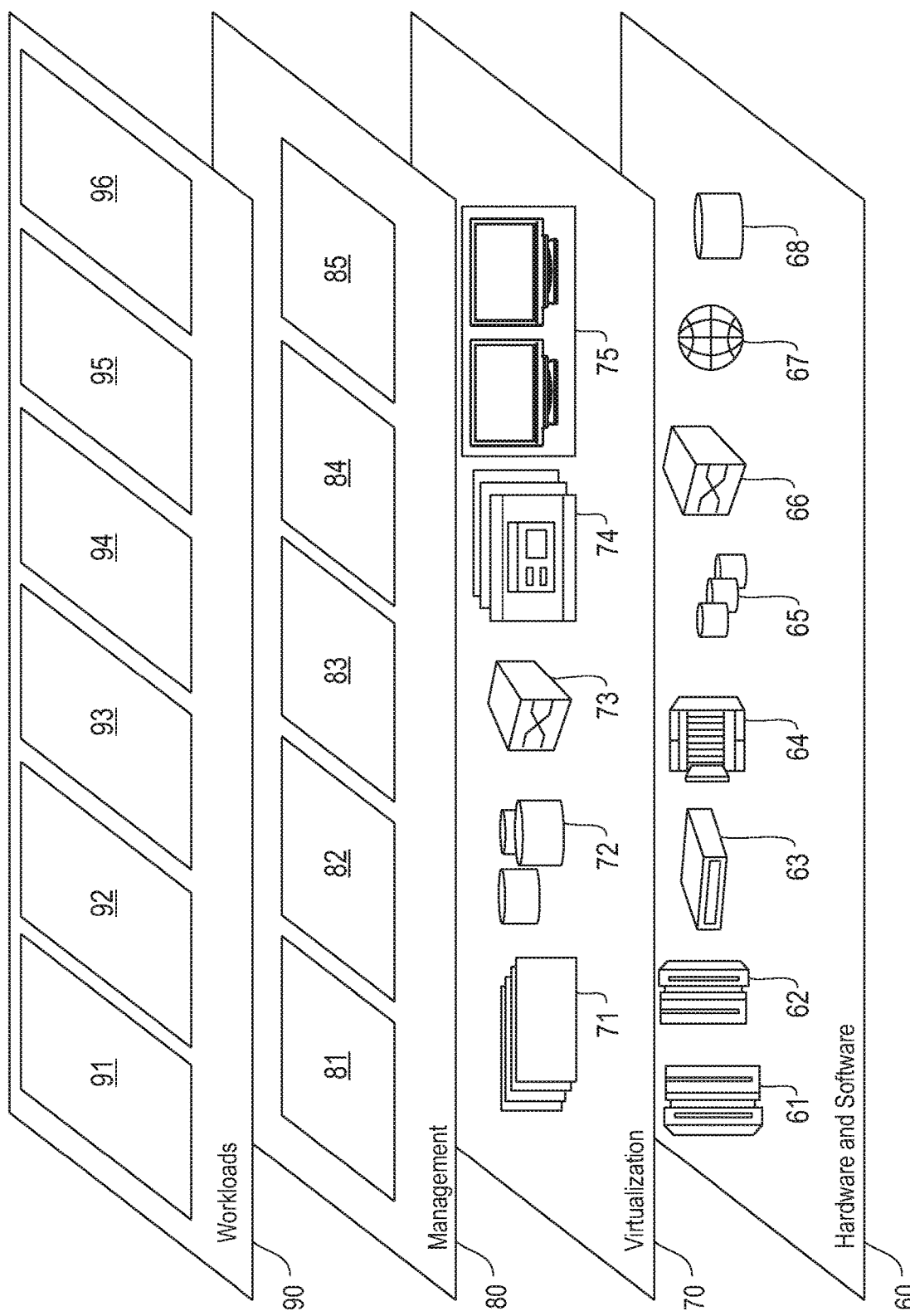
FIG. 3 is a block diagram depicting abstraction model layers, according to an embodiment of the present invention.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. SLA planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and, in the context of the illustrated embodiments of the present invention, various data compression functions 96. One of ordinary skill in the art will appreciate that the data compression functions 96 may also work in conjunction with other portions of the various abstractions layers, such as those in hardware and software 60, virtualization 70, management 80, and other workloads 90 (such as data analytics processing 94, for example) to accomplish the various purposes of the illustrated embodiments of the present invention.

Figure 4:
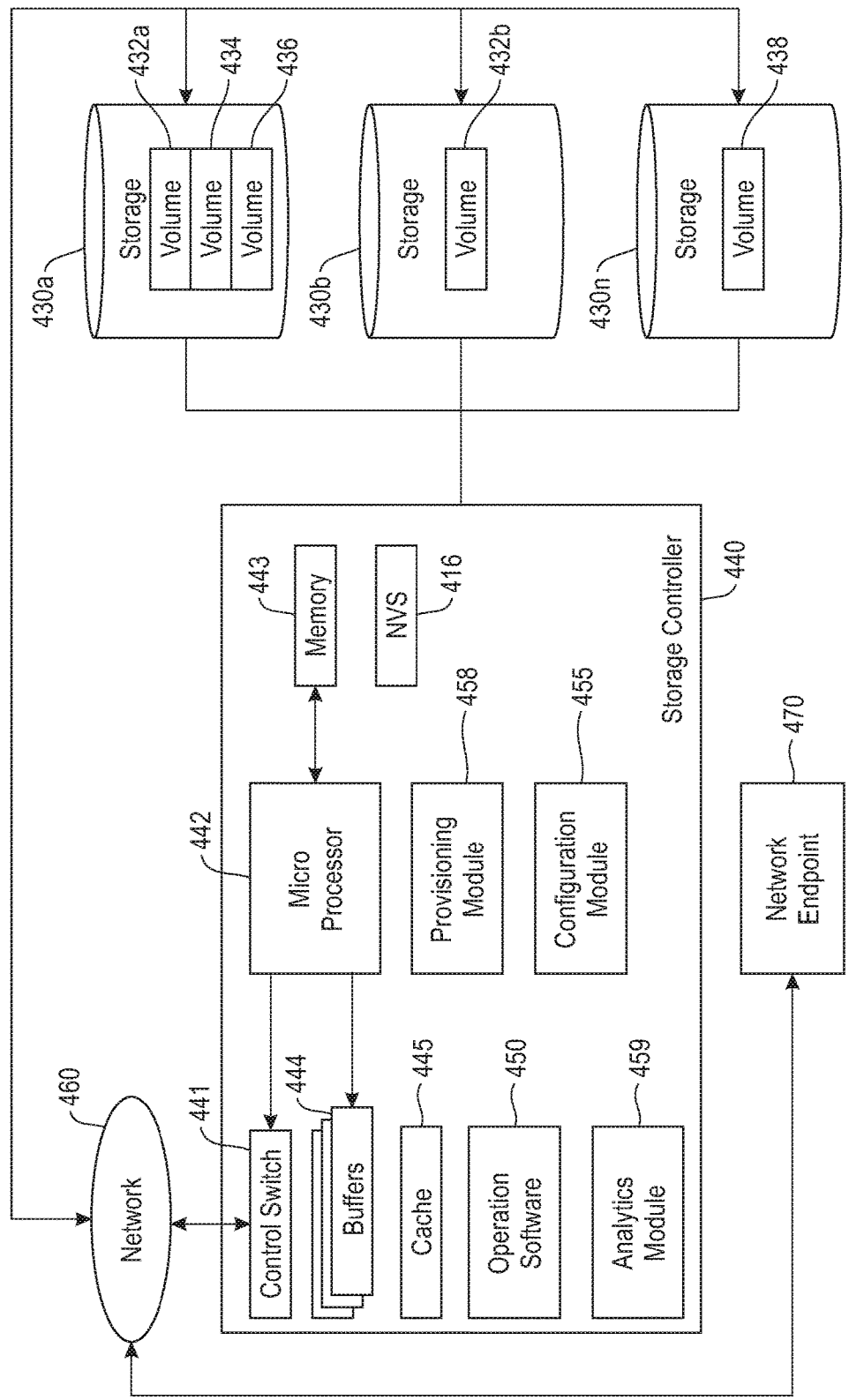
FIG. 4 is a block diagram depicting an exemplary hardware structure of a computing storage system in communication with the cloud computing environment, according to an embodiment of the present invention.

FIG. 4, following, is an additional block diagram showing a hardware structure of a data management system 400 that may be used in the overall context (i.e., as a portion of a distributed computing environment) of performing functionality according to various aspects of the present invention.

Network 460 may be a fibre channel (FC) fabric, a fibre channel point-to-point link, a fibre channel over Ethernet (FCoE) fabric or point to point link, a FICON or ESCON I/O interface, any other I/O interface type, a wireless network, a wired network, a LAN, a WAN, heterogeneous, homogeneous, public (i.e. the Internet), private, or any combination thereof. The ISP may provide local or distributed data among one or more locations and may be equipped with any type of fabric (or fabric channel) (not shown in FIG. 4) or network adapter 460 to the storage controller 440, such as Fibre channel, FICON, ESCON, Ethernet, fiber optic, wireless, or coaxial adapters. Network management system 400 is accordingly equipped with a suitable fabric (not shown in FIG. 4) or network adaptor 460 to communicate.

To facilitate a clearer understanding of the methods described herein, storage controller 440 is shown in FIG. 4 as a single processing unit, including a microprocessor 442, system memory 443 and nonvolatile storage ("NVS") 416. It is noted that in some embodiments, storage controller 440 is comprised of multiple processing units, each with their own processor complex and system memory, and interconnected by a dedicated network 460 within data storage system 400.

In a local or remote location, yet connected over network 460, storage 430 (labeled as 430a, 430b, and 430n herein) may be comprised of one or more storage devices, such as storage arrays, which are connected to storage controller 440 (e.g., by a storage network) as shown.

In some embodiments, the devices included in storage 430 may be connected in a loop architecture. Storage controller 440 manages storage 430 and facilitates the processing of write and read requests intended for storage 430. The system memory 443 of storage controller 440 stores program instructions and data, which the processor 442 may access for executing functions and method steps of the present invention for executing and managing storage 430 as described herein. In one embodiment, system memory 443 includes, is in association with, or is in communication with the operation software 450 for performing methods and operations described herein. As shown in FIG. 4, system memory 443 may also include or be in communication with a cache 445 for storage 430, also referred to herein as a "cache memory," for buffering "write data" and "read data," which respectively refer to write/read requests and their associated data. In one embodiment, cache 445 is allocated in a device external to system memory 443, yet remains accessible by microprocessor 442 and may serve to provide additional security against data loss, in addition to carrying out the operations as described herein.

In some embodiments, cache 445 is implemented with a volatile memory and non-volatile memory and coupled to microprocessor 442 via a local bus (not shown in FIG. 4) for enhanced performance of data storage system 400. The NVS 416 included in data storage controller 440 is accessible by microprocessor 442 and serves to provide additional support for operations and execution of the present invention as described in other figures. The NVS 416, may also be referred to as a "persistent" cache, or "cache memory" and is implemented with nonvolatile memory that may or may not utilize external power to retain data stored therein. The NVS 416 may be stored in and with the cache 445 for any purposes suited to accomplish the objectives of the present invention. In some embodiments, a backup power source (not shown in FIG. 4), such as a battery, supplies NVS 416 with sufficient power to retain the data stored therein in case of power loss to data storage system 400. In certain embodiments, the capacity of NVS 416 is less than or equal to the total capacity of cache 445.

Storage 430 may be physically comprised of one or more storage devices, such as storage arrays. A storage array is a logical grouping of individual storage devices, such as a hard disk. In certain embodiments, storage 430 is comprised of a JBOD (Just a Bunch of Disks) array or a RAID array. A collection of physical storage arrays may be further combined to form a rank, which dissociates the physical storage from the logical configuration. The storage space in a rank may be allocated into logical volumes, which define the storage location specified in a write/read request.

In one embodiment, by way of example only, the storage system as shown in FIG. 4 may include a logical volume, or simply "volume," may have different kinds of allocations. Storage 430a, 430b and 430n are shown as ranks in data storage system 400, and are referred to herein as rank 430a, 430b and 430n. Ranks may be local to data storage system 200, or may be located at a physically remote location. In other words, a local storage controller may connect with a remote storage controller and manage storage at the remote location. Rank 430a is shown configured with two entire volumes, 434 and 436, as well as one partial volume 432a. Rank 430b is shown with another partial volume 432b. Thus volume 432 is allocated across ranks 430a and 430b. Rank 430n is shown as being fully allocated to volume 438—that is, rank 430n refers to the entire physical storage for volume 438. From the above examples, it will be appreciated that a rank may be configured to include one or more partial and/or entire volumes. Volumes and ranks may further be divided into so-called "tracks," which represent a fixed block of storage. A track is therefore associated with a given volume and may be given a given rank.

A network endpoint 470 is connected through the network 460 as shown. The network endpoint 470 is generically intended to refer to any number of network devices, such as a switch, a router, a wireless access point, or another device known generally to one of ordinary skill in the art. As will be further illustrated in the following figures, a user may use a networked device, (e.g., a device connected to network 460) to access the network 260. The networked device may include computers, tablets, smartphones, television set top boxes, televisions and other video equipment, or even a household appliance such as a refrigerator or a garage door opener, again as one of ordinary skill in the art will appreciate. Ultimately any device having communicative ability to and through network 460 is anticipated to use the network endpoint 470. In one embodiment, the depiction of a network endpoint 470 serves to provide a point where an input object (data object) is introduced into a distributed computing environment, as will be described.

The storage controller 440 may include a configuration module 455 and a provisioning module 458, among other functional components. The configuration module 455 and provisioning module 458 may operate in conjunction with each and every component of the storage controller 440, and storage devices 430. The configuration module 455 and provisioning module 458 may be structurally one complete module or may be associated and/or included with other individual modules. The configuration module 455 and provisioning module 458 may also be located at least partially in the cache 445 or other components, as one of ordinary skill in the art will appreciate.

The configuration module 455 and provisioning module 458 may individually and/or collectively perform various aspects of the present invention as will be further described. For example, the configuration module 455 may perform various system configuration operations in accordance with aspects of the illustrated embodiments, such as configuring the storage controller 440 to operate using a given set of definitional information, for example. The analytics module 459 may use data analytics to compute, identify, organize, create, delete, sequester, or perform other actions on various patterns, trends, and other characteristics identified in the data over the network 460 and between other distributed computing components in a distributed computing environment. As one of ordinary skill in the art will appreciate, the configuration module 455, provisioning module 458, and analytics module 459 may make up only a subset of various functional and/or functionally responsible entities in the data storage system 400.

Other ancillary hardware may be associated with the storage system 400. For example, as shown, the storage controller 440 includes a control switch 441, a microprocessor 442 for controlling all the storage controller 440, a nonvolatile control memory 443 for storing a microprogram (operation software) 250 for controlling the operation of storage controller 440, data for control, cache 445 for temporarily storing (buffering) data, and buffers 444 for assisting the cache 445 to read and write data, a control switch 441 for controlling a protocol to control data transfer to or from the storage devices 430, the configuration module 455, provisioning module 458, or other blocks of functionality, in which information may be set. Multiple buffers 444 may be implemented with the present invention to assist with the operations as described herein.

Figure 5:
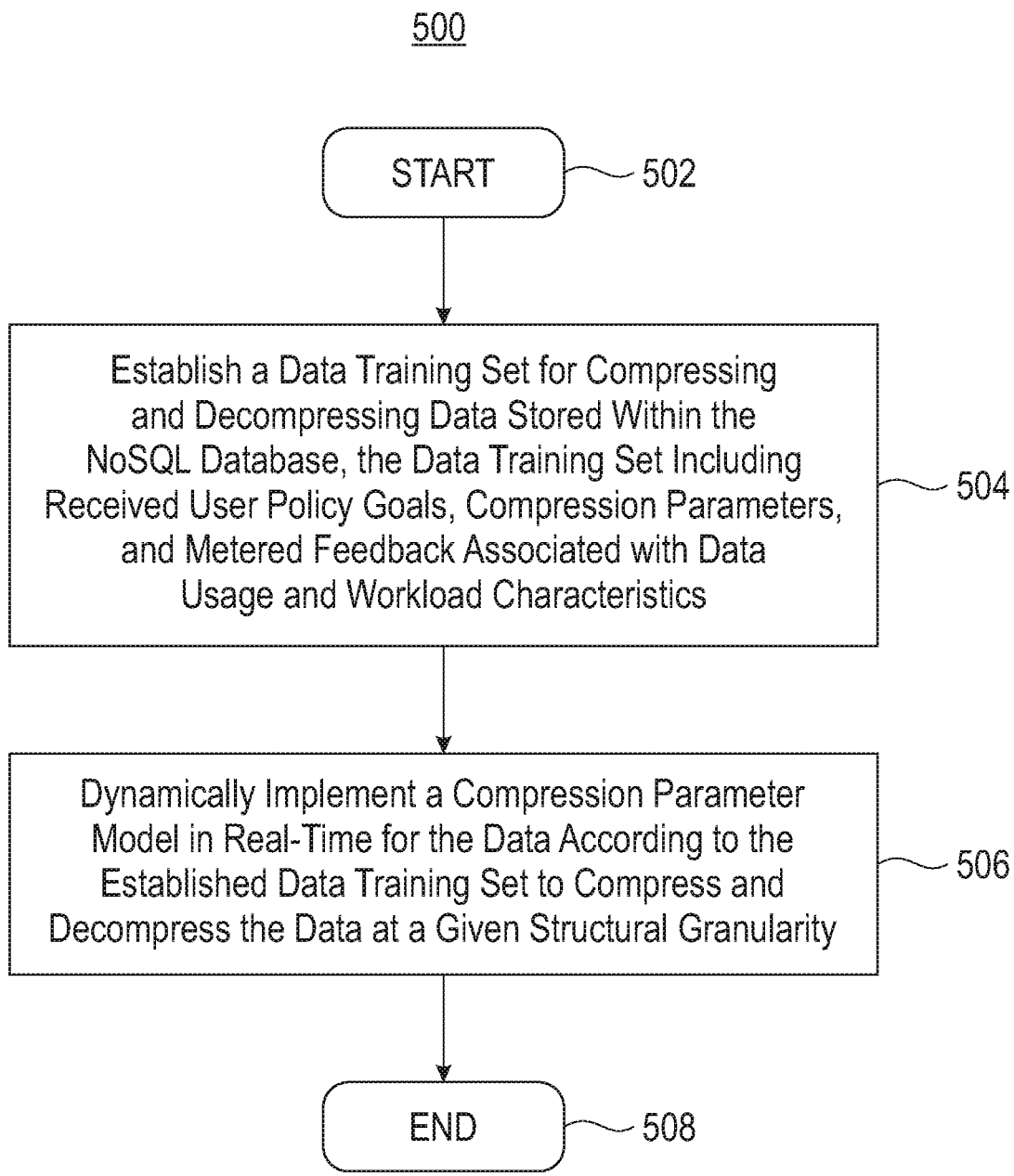
FIG. 5 is a flow chart diagram illustrating an exemplary method for cognitive compression with varying structural granularities in a NoSQL database, according to an embodiment of the present invention.

Continuing, FIG. 5 illustrates a method 500 for cognitive compression with varying structural granularities in a NoSQL database, in accordance with one embodiment of the present invention. The method 500 may be performed in accordance with the present invention in any of the environments depicted in FIGS. 1-4, among others, in various embodiments. Of course, more or less operations than those specifically described in FIG. 5 may be included in method 500, as would be understood by one of skill in the art upon reading the present descriptions.

Each of the steps of the method 500 may be performed by any suitable component of the operating environment. For example, in various embodiments, the method 500 may be partially or entirely performed by a processor, or some other device having one or more processors therein. The processor, e.g., processing circuit(s), chip(s), and/or module(s) implemented in hardware and/or software, and preferably having at least one hardware component may be utilized in any device to perform one or more steps of the method 500. Illustrative processors include, but are not limited to, a processor (i.e., a central processing unit (CPU), an application specific integrated circuit (ASIC), a field programmable gate array (FPGA), etc., combinations thereof, or any other suitable computing device known in the art.

The method 500 begins (step 502) by establishing a data training set for compressing and decompressing data stored within the NoSQL database. The data training set includes received user policy goals, compression parameters, and metered feedback associated with data usage and workload characteristics (step 504). A compression parameter model is then dynamically implemented in real-time for the data selected according to the established data training set to compress and decompress the data at a given structural granularity (step 506). The method 500 ends (step 508).

It should be noted as described herein, the term "cognitive" (or "cognition") may be relating to, being, or involving conscious intellectual activity such as, for example, thinking, reasoning, or remembering, that may be performed using a machine learning. In an additional aspect, cognitive or "cognition" may be the mental process of knowing, including aspects such as awareness, perception, reasoning and judgment. A machine learning system may use artificial reasoning to interpret data from one or more data sources (e.g., sensor based devices or other computing systems) and learn topics, concepts, and/or processes that may be determined and/or derived by machine learning.

In an additional aspect, cognitive or "cognition" may refer to a mental action or process of acquiring knowledge and understanding through thought, experience, and one or more senses using machine learning (which may include using sensor based devices or other computing systems that include audio or video devices). Cognitive may also refer to identifying patterns of behavior, leading to a "learning" of one or more events, operations, or processes. Thus, the cognitive model may, over time, develop semantic labels to apply to observed behavior and use a knowledge domain or ontology to store the learned observed behavior. In one embodiment, the system provides for progressive levels of complexity in what may be learned from the one or more events, operations, or processes.

In an additional aspect, the term cognitive may refer to a cognitive system. The cognitive system may be a specialized computer system, or set of computer systems, configured with hardware and/or software logic (in combination with hardware logic upon which the software executes) to emulate human cognitive functions. These cognitive systems apply human-like characteristics to conveying and manipulating ideas which, when combined with the inherent strengths of digital computing, can solve problems with a high degree of accuracy (e.g., within a defined percentage range or above an accuracy threshold) and resilience on a large scale. A cognitive system may perform one or more computer-implemented cognitive operations that approximate a human thought process while enabling a user or a computing system to interact in a more natural manner. A cognitive system may comprise artificial intelligence logic, such as natural language processing (NLP) based logic, for example, and machine learning logic, which may be provided as specialized hardware, software executed on hardware, or any combination of specialized hardware and software executed on hardware.

In general, such cognitive systems are able to perform the following functions: 1) Navigate the complexities of human language and understanding; 2) Ingest and process vast amounts of structured and unstructured data; 3) Generate and evaluate hypotheses; 4) Weigh and evaluate responses that are based only on relevant evidence; 5) Provide situation-specific advice, insights, estimations, determinations, evaluations, calculations, and guidance; 6) Improve knowledge and learn with each iteration and interaction through machine learning processes; 7) Enable decision making at the point of impact (contextual guidance); 8) Scale in proportion to a task, process, or operation; 9) Extend and magnify human expertise and cognition; 10) Identify resonating, human-like attributes and traits from natural language; 11) Deduce various language specific or agnostic attributes from natural language; 12) High degree of relevant recollection from data points (images, text, voice) (memorization and recall); and/or 13) Predict and sense with situational awareness operations that mimic human cognition based on experiences.

Figure 6:
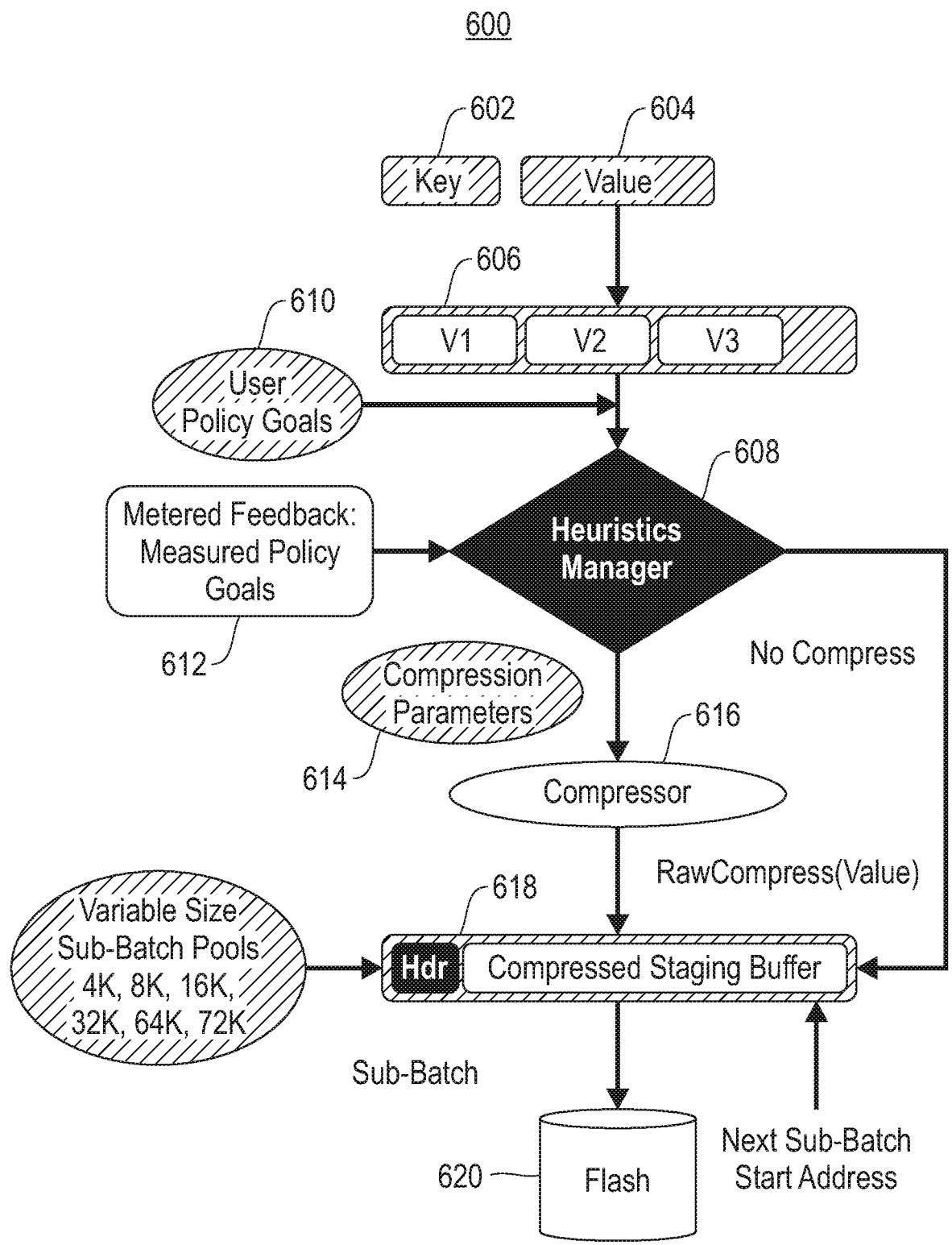
FIG. 6 is a block diagram depicting functional components of a general cognitive compression model, according to an embodiment of the present invention.

Turning now to FIG. 6, a block diagram depicting functional components of a general cognitive compression system 600 is illustrated. Although each of the functional components will be further detailed, following, model 600 details an overview of the cognitive compression system disclosed herein. System 600 includes first a key 602 and value 604 used to identify a specific record. The given record, according to its key 602 and value 604 indications, are then positioned in an uncompressed staging buffer 606 (depicted in model 600 having multiple record values therein). When determining which compression model to be utilized to compress the given record(s), which models again will be further discussed following, the system 600 considers user policy goals 610 associated with the given record which are specified by a particular user. In some embodiments, the user policy goals 610 may include a capacity usage and/or provisioning information for the given record/storage device association. The user policy goals 610 may additionally include write latency requirements and/or input/output operations per second (IOPs). Finally, the user policy goals may include CPU, memory, and/or other resource usage necessitated to process the given record.

The user policy goals 610 may be input as a portion of information considered by a heuristics manager 608 which ultimately is responsible for determining when and when not to compress the data, and which compression model to utilize when doing so. The heuristics manager 608 may be provided (and may subsequently iteratively output) metrics associated with a learning/training input set. For example, when selecting the appropriate compression model, the heuristics manager 608 may consider information identified from metered feedback 612 of measured policy goals of previous data input through the system 600. That is, metered feedback 612 may include information, for example, regarding whether a previously chosen compression model for a particular workload type satisfied the defined user policy goals 610. This feedback is iteratively used to train the system 600 cognitively (according to the aforementioned definition) to subsequently determine appropriate decisions as to which compression model or method to apply to workloads of a similar type.

The heuristics manager 608 may further identify, as part of the training input set, a stream type of the data such as whether the stream is a foreground stream (e.g., user data or checkpoint data) or a background stream (e.g., garbage collection data or metadata). This training input set may also consider workload characteristics of the given data, such as the compression ratio, data arrival rates, and data access rates of the data processed by the system 600.

The heuristics manager 608 of the system 600 further considers compression parameters 614 when generating decisions as to what compression model to apply to given data. The compression parameters 614 may include, for example, different structural granularities of record data (e.g., batch, sub-batch, or individual record sizes), different points of compression (e.g., inline or background compression), and/or compression timing (e.g., synchronously or asynchronously). Ultimately, the heuristics manager 608 determines, using all characteristics and input information previously discussed, a compression parameter model to compress and/or decompress the data. Some non-limiting examples of a selected compression parameter model may include a multiple linear regression model and a multinomial logistic regression model.

Using the given compression model, and assuming the heuristics manager 608 has determined to actually compress the data (note that the heuristic manager may choose not to compress the data by simply adding the record to a compressed staging buffer 618 while bypassing the compressor 616), the data is then compressed by the compressor 616 into the compressed staging buffer 618. This compressed staging buffer may include the data at its given structural granularity, for example, in variable size sub-bath pools. A sub-batch is defined as a collection of one or more records that fit in a pre-defined range of sub-batch sizes (such as 4 KB, 8 KB, 16 KB, 32 KB, 72 KB). The sub-batch size is selected at runtime based on the compressibility of the data, and the guarantees for durability to provide. For example, a highly compressible data record might benefit from a smaller sub-batch size; whereas a large non-compressible data record would benefit from a larger sub-batch. The least sub-batch size able to fit a record is selected to provide the best possible latencies and IOPs with multiple shards. Also ensured is that the sub-batch size is always aligned with the write page size of the underlying storage device, such as the depicted flash storage device 620.

Training Input: Foreground Data Stream

As mentioned previously, information associated with multiple characteristics and parameters may be used as the training input set to iteratively train the system 600 to select the most appropriate compression model and method according to the given data of a record. For a foreground data stream, the compression is performed within the I/O path itself, where user data is compressed via inline and synchronous compression and checkpoint data is compressed via asynchronous compression at a given sub-batch size. In one example, user data may be compressed using the Snappy compression library for faster and more efficient compression and decompression rates. The user data may be selected at a smaller sub-batch size aligned with the write page of the underlying storage device to provide less read amplification. Checkpoint data, in one example, may be compressed using the Zlib compression library for stream-based compression to pack the data more aggressively, and may be aggregated into larger sub-batch sizes to enable better write IOPs. Ultimately, this input results in less fragmentation of the data and better write latencies where the compression ratio*buffer size>=alpha*sub-batch size.

Training Input: Background Data Stream

For a background data stream, compression may be performed, for example, during garbage collection and compaction paths (e.g., read-compress-write) and/or as a recovery path for reading and reconstructing index data from metadata records. Larger sub-batch sizes and stream compression may be used to compress the garbage collection and compaction data records more effectively and to bulk load the index data from the larger sub-batches using stream decompression on the recovery path to enable faster recovery times.

Training Input: Compression Ratio

The compression ratio describes the compressibility of the data may be used to select the compression mechanism used, the sub-batch size, and whether synchronous or asynchronous compression is used in the I/O path. Highly compressible data, for example, may be segregated into smaller sub-batch sizes aligned with the write page of the storage device and may be compressed using a raw compression method synchronously in the I/O path. Less compressible data, for example, may be aggregated into larger sub-batches and may be compressed using a stream compression method asynchronously in the I/O path.

Training Input: Data Arrival Rate

The data arrival rate identifies the arrival rate of client data into the system 600, and may be used to select the size of the sub-batch and/or a tradeoff between compression and the I/O rate using a sliding data window. For high ingestion rates, for example, a larger alpha parameter may be used to pack more records together, while a slow data stream may require smaller sub-batch sizes to maximize capacity savings and reduce write latency.

Training Input: Data Access Rate

The data access rate defines the data popularity or frequency of access, and may be used to select the correct sub-batch size and whether a trade-off between capacity savings and read performance is necessitated. Data having a high popularity (i.e., data accessed more frequently when compared with other data), for example, may be placed in smaller sub-batch sizes such that the individual record is read and decompressed at a finer granularity (i.e., so that multiple records need not be decompressed to satisfy only a single record read). Data having a lower popularity, for example, may be placed into larger sub-batches to enable a higher compression ratio with out-of-record data as well as increase capacity savings. In some embodiments, the index may maintain the sub-batch size, sub-batch offset and record offset information.

Inline Record Compression and Decompression for Synchronous I/O Paths

Figure 7:
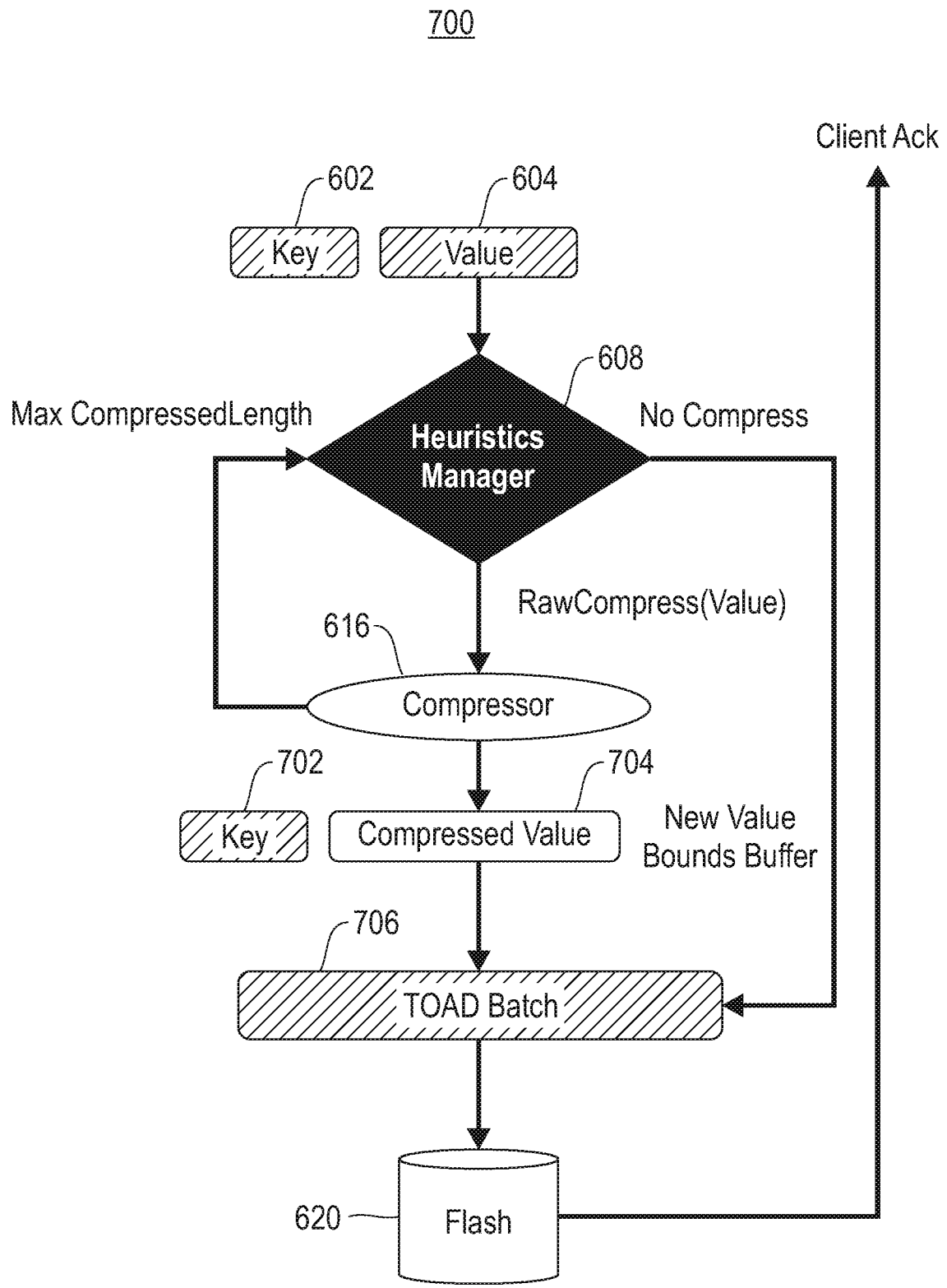
FIG. 7 is a block diagram depicting functional components of a synchronous inline cognitive compression model, according to an embodiment of the present invention.

Turning now to FIG. 7, a block diagram depicting functional components of a synchronous inline cognitive compression model 700 is illustrated. In this model, the approach is to compress the record (key 602 and/or values 604) before the record is inserted in a batch to be written to the flash storage device 620, which is performed as follows.

The synchronous read and write I/O paths are first modified to provide support for inline record compression. The values of the records are extracted in the write path and compressed using the Snappy compression codec. In some implementations, a set of 6 compression API are exposed to the read/write code paths:

String-Based Compression:
size_t ValueCompressor::Compress(const char*input, size_t input size, std::string*compressed)
bool ValueCompressor::Uncompress(const char*compressed, size_t compressed_length, std::string*uncompressed)

Stream-Based Compression:
size_t Compress(Source*source, Sink*sink)
bool Uncompress(Source*compressed, Sink*uncompressed)
size_t UncompressAsMuchAsPossible(Source*compressed, Sink*uncompressed)

Raw Byte Array-based Compression:
void ValueCompressor::RawCompress(const char*input, size_t input size, char*compressed, size_t*compressed_length)
bool ValueCompressor::RawUncompress(const char*compressed, size_t compressed_length, char*uncompressed)

Maximum Compressed Length for Memory Allocation and Heuristics:
size_t ValueCompressor::MaxCompressedLength(size_t source_bytes)

Uncompressed Length for Memory Allocation and Heuristics:

bool    ValueCompressor::GetUncompressedLength(const char*compressed, size_t compressed_length, size_t*result)

With this API, a ValueCompressor object is composed for each shard, with the added effect that this minimizes contention by compressing the records for each shard separately. Compression and decompression work in the I/O path as follows for the synchronous reads and writes, and raw compression and decompression that operates on character arrays is used which is more efficient than the higher-level string-based or stream-based compression methods.

Compression on the synchronous I/O path then consists of the following steps to be performed before inserting the compressed record into the in-memory batch for each shard. A) A record value compressor is initiated for a shard; B) For a given record (defined by its key 602 and/or value 604), the maximum compressible length of the record value is computed using the MaxCompressedLength API in the heuristics manager 608; C) A memory buffer for the maximum compressible length is allocated; D) Raw compression of the value buffer is performed with data between value bounds using the RawCompress API in the compressor 616; E) A new value bounds buffer is constructed which is allocated with the new compressed data (key 702) and new compressed length (value 704); F) The new compressed value bound buffer is written synchronously by inserting it into the batch 706 and flushing it to the flash storage device 620 within a single record transaction; and G) The memory buffer used for compression is de-allocated.

Figure 8:
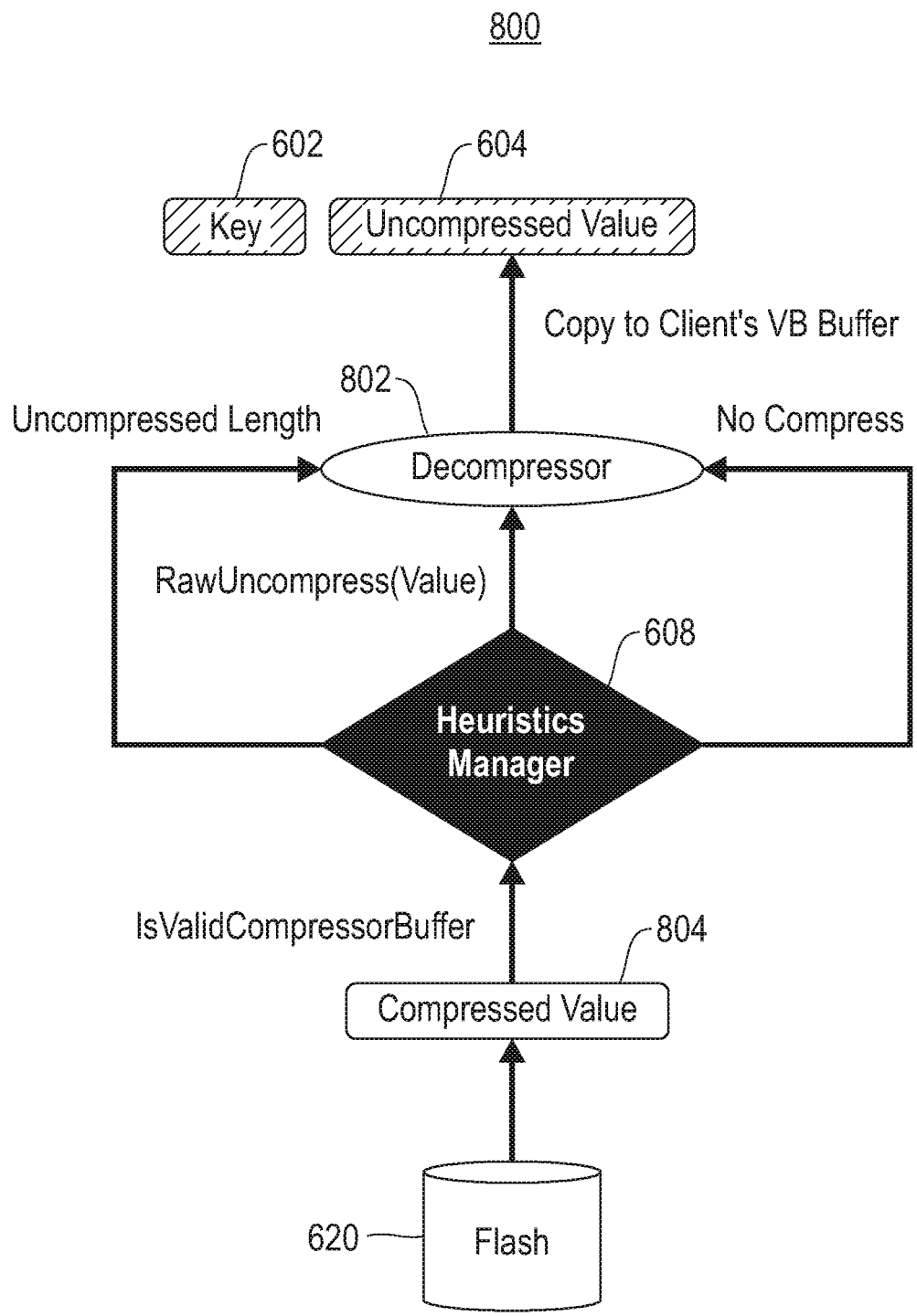
FIG. 8 is a block diagram depicting functional components of a synchronous inline cognitive decompression model, according to an embodiment of the present invention.

Decompression consists of the following steps to be performed before returning the decompressed record to the client, as illustrated in the functional components of a synchronous inline cognitive decompression model 800 of FIG. 8. A) For a given record get, the record is retrieved from the flash storage device 620 (or alternative HDD, SDD, etc. storage device) using the compressed length of associated value 804 read from storage; B) The uncompressed length is found using the compressed value and its length using the GetUncompressedLength API in the heuristics manager 608; C) A memory buffer for the uncompressed length is allocated; D) The raw decompression is performed in the decompressor 802 from the compressed data buffer into the memory buffer using the RawUncompress API; E) The memory buffer is copied to the client's value buffer and the length is updated to the uncompressed length (key 602 and/or uncompressed value 604); F) The memory buffer used for decompression is de-allocated; and G) The uncompressed record is returned to the client.

Inline Record Compression and Decompression for Asynchronous I/O Paths

Figure 9:
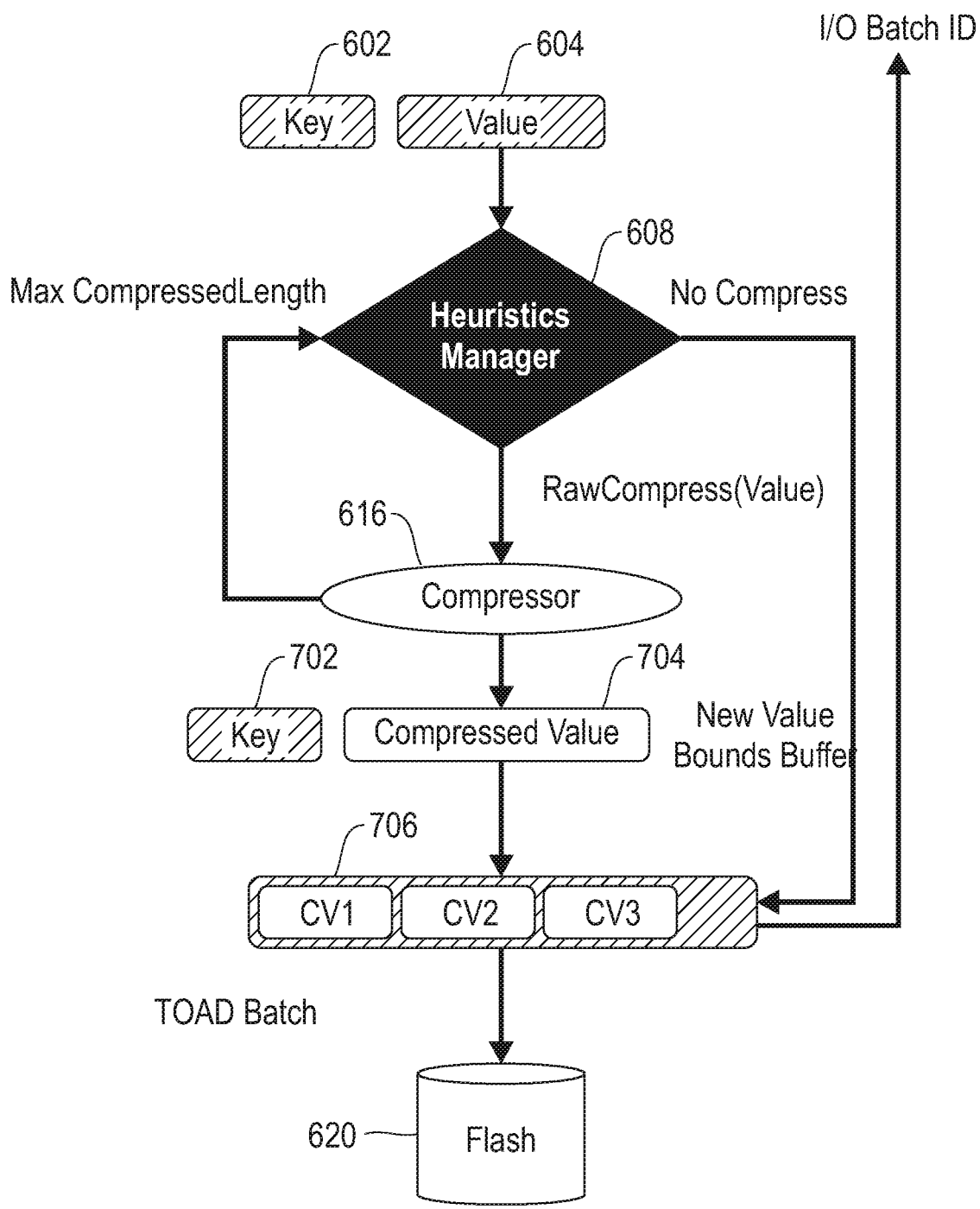
FIG. 9 is a block diagram depicting functional components of an asynchronous inline cognitive compression model, according to an embodiment of the present invention.

Turning now to FIG. 9, a block diagram depicting functional components of an asynchronous inline cognitive compression model 900 is illustrated. The inline record compression for the asynchronous I/O paths uses the same compression and decompression APIs as mentioned above, and the ValueCompressor object in the shard is used to compress and decompress during the insert and get with enabled callback.

Before inserting the compressed record into the in-memory batch for each shard, the batch is flushed asynchronously when the combined sum of compressed record sizes exceed the batch size of the batch 706, or if there is a synchronous I/O that arrives prior. The major difference in the design and implementation on the asynchronous I/O path is the insertion of the compressed value 704 in the batch 706 and its buffer pointer in the callback context; returning the I/O batch identification; and the use of callback routines for the decompression I/O path.

The flow is as follows. A) A record value compressor is initialized for a shard (identified by its key 602 and/or value 604); B) For a given record, the maximum compressible length of the record value is computed using the MaxCompressedLength API in the heuristics manager 608; C) A memory buffer for the maximum compressible length is allocated; D) Raw compression is performed in the compressor 616 of the value buffer with data between value bounds using the RawCompress API; E) A new value bounds buffer is constructed which is allocated with the new compressed data 702 and new compressed length 704; F) The new compressed value bound buffer is inserted into the batch 706 within a single record transaction and the compressed memory buffer pointer in the callback context; G) The client is returned the I/O batch ID corresponding to the single record transaction for the compressed record; and H) On the write callback path, the callback context is retrieved and the compressed memory buffer is deleted.

Decompression requires the following steps to be performed in the get I/O path with callback enabled. The decompression on the get I/O path happens in the callback routine registered with the get before the data is actually returned to the client. The steps are performed as follows. A) The asynchronous get for the key 602 is registered with its callback, and passed onto the user's value buffer bounds to the underlying layers—this is returned to the client; B) For a given record get, when the record is read from the storage and the internal callback is triggered; the compressed length of the associated value read from storage is found; C) The uncompressed length is found using the compressed value and its length using the GetUncompressedLength API in the heuristics manager 608; D) A memory buffer for the uncompressed length is allocated; E) The raw decompression is performed by the decompressor 802 from the compressed data buffer into the memory buffer using the RawUncompress API; E) The memory buffer is copied to the client's value buffer retrieved from the callback context, and the length is updated to the uncompressed length; F) The memory buffer used for decompression is de-allocated; and G) The decompressed record is returned to the client in the original value bounds buffer.

Batch Compression

Figure 10:
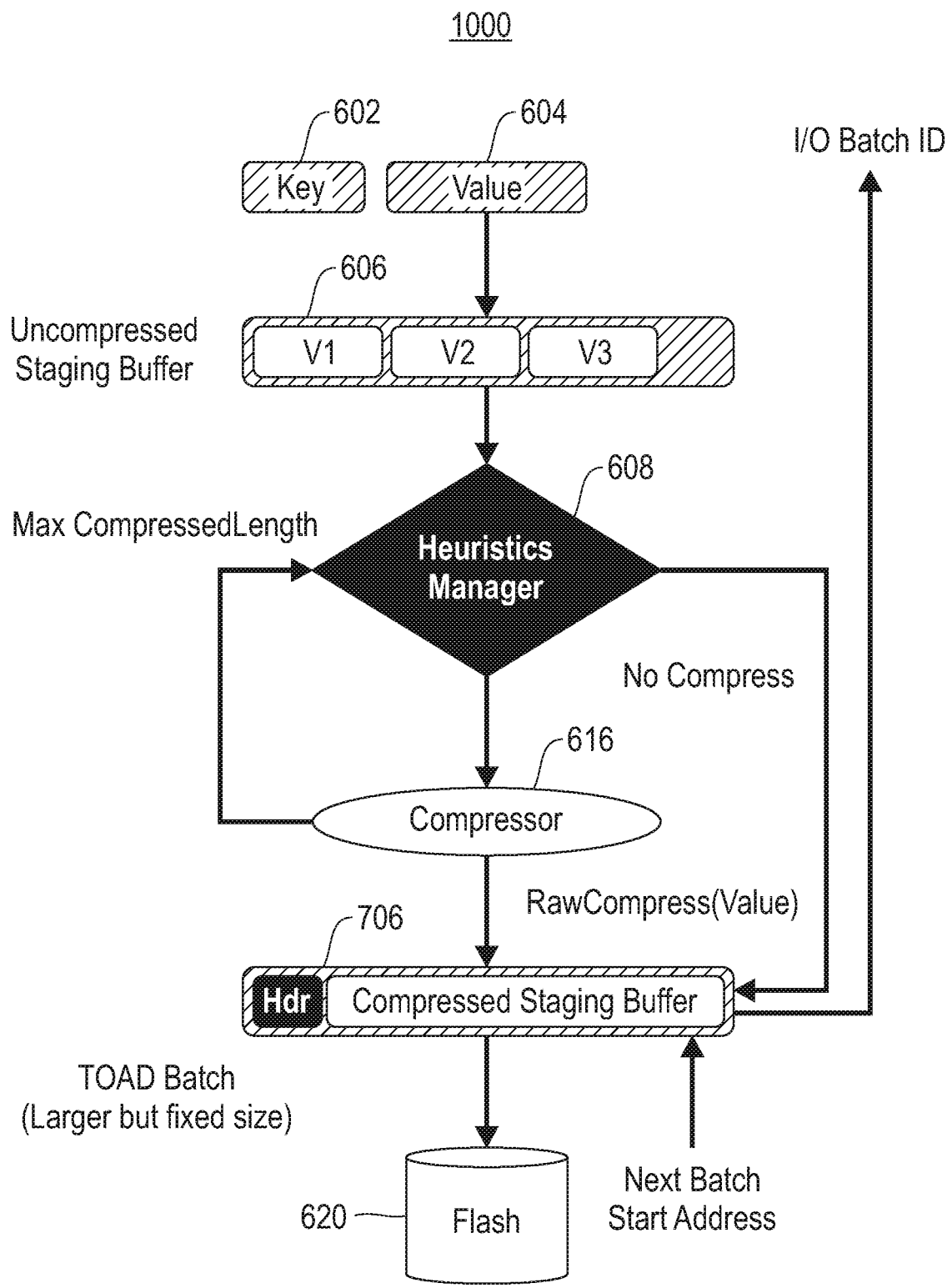
FIG. 10 is a block diagram depicting functional components of a cognitive batch compression model, according to an embodiment of the present invention.

Referring now to FIG. 10, a block diagram depicting functional components of a cognitive batch compression model 1000 is illustrated—in this section, the design of batch-level compression is discussed. It should be noted that several of the functional elements of FIGS. 6-9 are used to implement the model 1000, and are not re-described in detail for brevity.

Batch-level compression requires changes to the compression of batches before flush, checksum over compressed batches, changes to the batch headers, realignment of compressed batches on the storage, index update process, and computation of the next batch offset. Following is a description of each point in detail.

Compression of Batches

The first step in batch-level compression is to accumulate the records in a separate compression buffer (i.e., the uncompressed staging buffer 606). When the buffer size grows to a pre-defined threshold (compression ratio*buffer size>=alpha*batch size); the compression of the compression buffer is performed in a separate thread by the compressor 616 into the compressed batch 706. Alpha is a threshold to ensure minimum space amplification and fit the compressed buffer within the batch size. The foreground writes are inserted into a new compression buffer, meanwhile, although only two compression buffers should be generally. This restricts the number of threads and memory for buffers used for each shard to two.

Checksums

The second step before writing the batches is to compute a new checksum on the compressed data in the batches. This is the checksum that would be used to verify the contents of the batches on the read path if enabled. The checksums are stored in a similar manner on storage, except that they now represent the compressed batches.

Batch Header

The batch header on storage needs to be updated with the compressed length (i.e., the batch header of batch 706). In addition, the uncompressed length of the batch, a flag marking if the batch was compressed, and optional compression parameters are written. The compression flag, uncompressed and compressed lengths in the batch header assist the iteration and recovery paths to read the correct amount of data from storage. This also helps to keep the read amplification low with the support for variable batch sizes.

Index Update

After the batch 706 is written to the flash storage device 620, the index needs to be updated with the addresses of the records written in that batch. The new address of each record on storage is now a combination of the start address of the compressed batch on storage and the offset in the uncompressed batch in memory. The total number of bytes used to store is still the same as we can encode the offset in uncompressed batch as least significant bits of the compressed batch start address. For uncompressed batches, the offset is the physical offset in the uncompressed batches. Thus, the combined address can be directly used to find the physical address of the record.

Next Batch Start Address and Alignment

Since the compressed batch size may not be a multiple of the write page size of the underlying storage device, align the next batch start address is aligned as a multiple of the write page size, notwithstanding this results in a small fragmentation by leaving space at most equal to the write page size per batch. In general, the capacity savings with compression and write performance improvement with alignment would trade-off for the unused space.

I/O Paths for Batch Compression and Decompression

There are three major differences between inline record compression and batch compression: the records are originally enqueued in a separate uncompressed write buffer, the compression is applied on the write buffer to convert it into a compressed write batch, and the index is updated with the record addresses for the compressed write batch. The raw compression API is therefore used as it provides more efficiency than string and stream-based APIs.

During the read, the index is looked up for the batch start address and the batch header is read from that location on storage. Next, it is determined from the batch header if a batch is compressed or not. The batch compressed and uncompressed lengths are then both read from the header. If the batch is compressed, those bytes for the compressed batch size aligned with the storage read page size are read. If the batch in not compressed, the uncompressed batch size aligned with the storage read page size is read. Next, the batch is decompressed in an in-memory buffer, and the offset from within the index address is located to find the record in the in-memory buffer. The record with the decompressed value is copied to the client's buffer and returned to the client.

Figure 11:
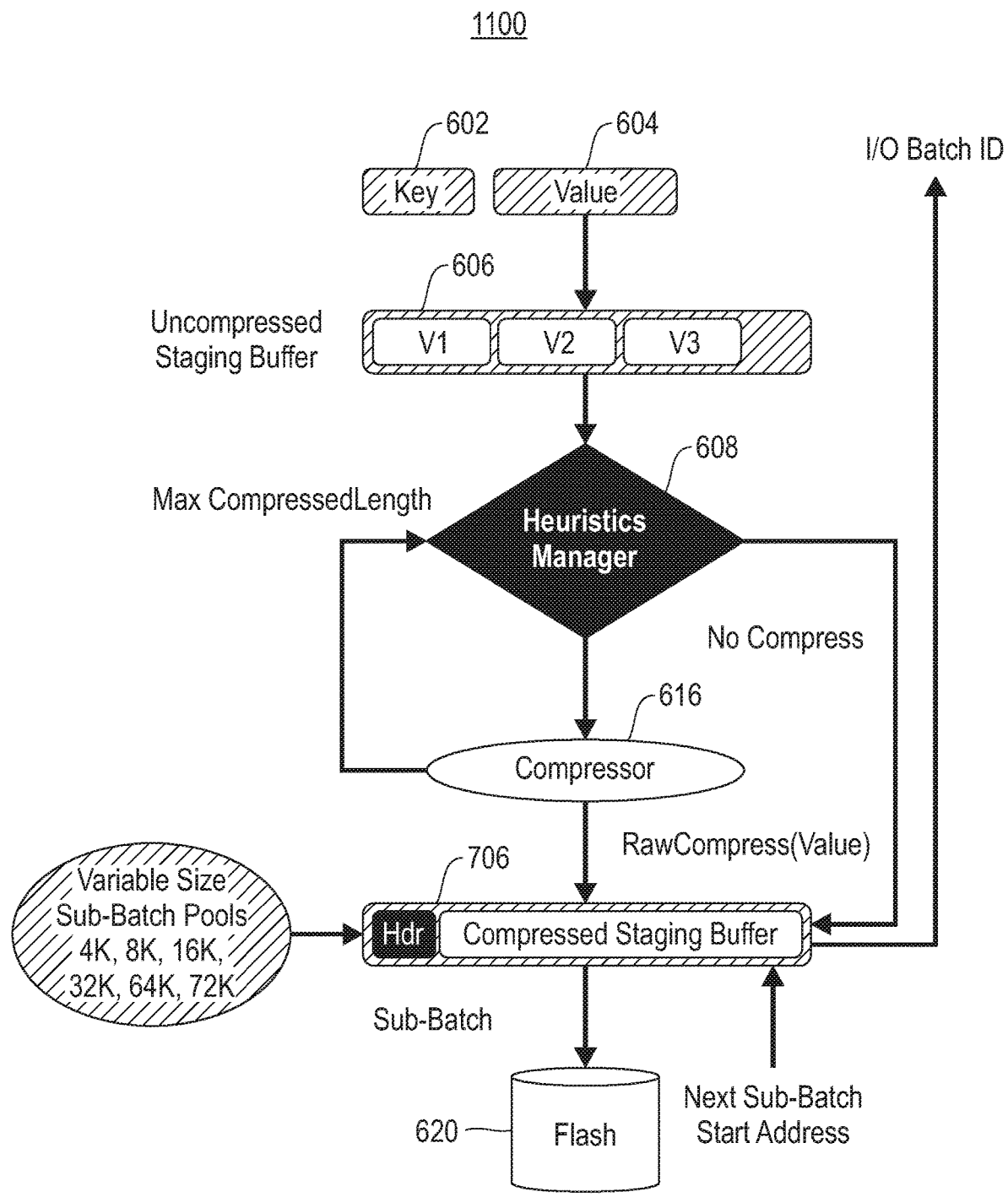
FIG. 11 is a block diagram depicting functional components of a cognitive sub-batch compression model, according to an embodiment of the present invention.

Compression at the batch-level results in read amplification for reading a record. This is because the complete batch needs to be decompressed and the record located using the index address in the decompressed batch. To overcome the read amplification in batch compression, the following sub-batch compression technique as illustrated in the cognitive sub-batch compression model 1100 of FIG. 11. It should be noted again that several of the functional elements of FIGS. 6-10 are used to implement the model 1100, and are not re-described in detail for brevity.

Sub-Batch or Variable Batch Size Compression

In batch-level compression, multiple records may be accumulated in the batch before compressing and writing the batch to storage. However, this results in read amplification during the read path because the complete batch must be read and decompressed before obtaining the record subsequently.

Sub-batch or variable batch size compression is therefore proposed where batches from within a range of sub-batch sizes are allocated. This reduces the space amplification during reads and write, and also improve both the read/write latencies by minimizing the unused space when using a static batch size for inline record compression or batch-level compression.

As mentioned previously, a sub-batch is defined as a collection of one or more records that fit in a pre-defined range of sub-batch sizes (such as 4 KB, 8 KB, 16 KB, 32 KB, 72 KB). The sub-batch size is selected at runtime based on the compressibility of the data, and the guarantees for durability to provide. For example, a highly compressible data record might benefit from a smaller sub-batch size; whereas a large non-compressible data record would benefit from a larger sub-batch. The least sub-batch size able to fit a record is selected to provide the best possible latencies and IOPs with multiple shards. Also ensured is that the sub-batch size is always aligned with the write page size of the underlying storage device, such as the depicted flash storage device 620. Now described are the steps in the I/O path for compression and decompression of sub-batches.

I/O Paths for Sub-Batch Compression and Decompression

On the write path, the following steps are performed for sub-batch compression. A) The sub-batch offset is computed within the slot and the offset is recorded within the uncompressed sub-batch (i.e., within the uncompressed staging buffer 606). In addition to the sub-batch offset and record offset, optionally the sub-batch compressed length is included when updating the index after the write has been made durable to storage (this helps to reduce the number of reads to storage for sub-batch header); B) The records in the uncompressed memory buffer corresponding to the sub-batch are compressed by the compressor 616. The uncompressed memory buffer is compressed as soon as its compressed size reaches close to the sub-batch size (compression ratio*buffer size>=alpha*sub-batch size). The sub-batch size is the selected to be the lowest in the range of sub-batch sizes that fits the compressed buffer, which enables the minimization of the write latencies and the space amplification for both reads and writes;

C) The compressed sub-batch is then aligned with the write page size of the underlying storage device (i.e., the flash storage device 620, or alternative storage device). In addition, a sub-batch header is created in the compressed staging buffer 706 to record if the sub-batch was compressed or not, the compressed size, the uncompressed size, and other optional compression parameters. The read path may inquire the compressed length from the index. However, in the absence of the index, the recovery path gathers this information by reading the sub-batch header while iterating over the shard; D) Before writing the sub-batch, a checksum is taken over the compressed sub-batch payload and stored in the sub-batch header. This enables verifying the integrity of sub-batch data retrieved during read or recovery paths; and E) Finally, the sub-batch header and sub-batch payload is written to the storage device and the index is updated with the sub-batch offset, record offset, and sub-batch length.

On the read path, the following steps are performed for sub-batch decompression. The use of sub-batches reduces the read amplification by reading the minimum amount of data required to read a record, and as a result, this both improves read/write latencies and space amplification. A) First, the index is looked up to find the sub-batch offset and the record offset in the uncompressed sub-batch. The sub-batch length is also optionally available in the index corresponding to the key to be looked up. As a result, the system can directly read the sub-batch without reading the sub-batch header; B) If the sub-batch length is not available within the index or the sub-batch is being read during an iteration or recovery path, the sub-batch header is read to find the compressed sub-batch length; C) The sub-batch payload is read aligned with the sub-batch length and the read page of the underlying device; D) The checksum is computed on the payload and compared against the stored checksum in the sub-batch header to verify the integrity of the data; E) Next, the sub-batch payload is decompressed in a memory buffer allocated for the uncompressed length computed from the GetUncompressedLength API; and F) The record is located within the uncompressed sub-batch with the record offset retrieved from the index and returned to the client.

Selecting the right compression mechanism is important. There are different choices between inline record compression on the synchronous or asynchronous path, batch-level compression, and finer sub-batch compression. This enables the best possible capacity savings for minimum space fragmentation, lowest possible read amplification during the read path, and minimum write latency with the support for variable batch size.

As a result, the workload characteristics and data type identified by the heuristics manager 608 are paramount for selecting the right compression mechanism. The system thus classifies workload characteristics and data type in the following categories:

Compression Ratio

Compressibility of data is an important metric to select the right compression mechanism and the batch size. A highly compressible record with a lower compression ratio is well suited for a smaller sub-batch aligned with the write page size. In contrast, large or more random (less compressible) data records are better suited for being written in larger batch sizes. The alpha parameter in the in-equality (compression ratio*buffer size>=alpha*sub-batch size) can be adjusted based on the compressibility ratio of the data to enable less space fragmentation and better write latencies.

Data Arrival Rate

The rate of request arrival from clients also dictates the sub-batch size to match the compression and I/O rate. If the arrival rate of record inserts is high, then sub-batches would get filled quickly and multiple records could be packed together tightly. As a result, the compression heuristics would select a large alpha parameter for high data arrival rate. In contrast, for a slow stream of data, the system can compress each record individually or select smaller sub-batches to maximize the capacity savings and reduce the write latency. The heuristic engine monitors the data arrival rate and adaptively adjusts the sub-batch size for each sliding window in the request data stream.

Data Access Rate

In addition to data arrival rate, the get queries also enable a determination of the popularity or frequency of access. In most commercial key-value stores and storage engines, a read cache is used to store the data in uncompressed format. The cache comprises of uncompressed data in memory and on storage in the first few levels of compaction. The log is the primary store for all records. This property can be taken advantage of by storing the records with a high data access rate uncompressed on storage or use a smaller sub-batch size so that they can be individually read and decompressed at a finer granularity. The index maintains the information if a record is compressed and its compressed sub-batch size along with the sub-batch offset and record offset. As a result, the system saves resources on reading the sub-batch header for most frequently accessed records as well. For records with lower data access rate, the heuristics engine selects a larger sub-batch size, which also enables better compression ratio with out-of-record data and higher capacity savings.

Metadata and Index Checkpoints

Checkpoints are used in the metadata by inserting the checkpoint in the in-memory batch. As a result, the system can always use a larger sub-batch for metadata records so that the sub-batch may be compressed more effectively so as to bulk load the index from the larger metadata sub-batches on recovery path. This would result in quicker recovery of the index when the node is recovered after a crash.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowcharts and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowcharts and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowcharts and/or block diagram block or blocks.

The flowcharts and block diagrams in the Figures illustrate the architecture, functionality, and operation of possible implementations of systems, methods, and computer program products according to various embodiments of the present invention. In this regard, each block in the flowcharts or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts or carry out combinations of special purpose hardware and computer instructions.

The invention claimed is:

1. A method for cognitive compression with varying structural granularities in a NoSQL database, by a processor, comprising:
   establishing a data training set used to determine a timing and a given structural granularity at which to compress and decompress data stored within the NoSQL database; wherein the data training set includes received user policy goals, compression parameters, and metered feedback associated with data usage and workload characteristics; and
   dynamically implementing a compression parameter model in real-time for certain data of the data stored within the NoSQL database, selected according to the established data training set, to compress and decompress the certain data at the given structural granularity.

2. The method of claim 1, wherein the user policy goals include at least one of: a capacity usage, a write latency, Input/Output Operations per Second (IOPS), and a resource usage of the data.

3. The method of claim 1, wherein the compression parameters include at least one of: inline or background compression, synchronous or asynchronous compression, and batch or sub-batch compression.

4. The method of claim 1, wherein the data usage and workload characteristics include at least one of: a compression ratio, a data arrival and ingestion rate, and a data access rate.

5. The method of claim 1, wherein the training data set further utilizes a stream type, the stream type including at least one of:
   a foreground data stream including compression of user data and checkpoint data; and
   a background data stream including compression of garbage collection data and metadata.

6. The method of claim 1, further including exposing at least one of a plurality of compression application programming interfaces (APIs) to a read/write path of the certain data according to the selected compression parameter model.

7. The method of claim 1, wherein the compression parameter model includes at least one of: a multiple linear regression model and a multinomial logistic regression model.

8. A system for cognitive compression with varying structural granularities in a NoSQL database, comprising:
a processor executing instructions stored in a memory; wherein the processor:
establishes a data training set used to determine a timing and a given structural granularity at which to compress and decompress data stored within the NoSQL database; wherein the data training set includes received user policy goals, compression parameters, and metered feedback associated with data usage and workload characteristics; and
dynamically implements a compression parameter model in real-time for certain data of the data stored within the NoSQL database, selected according to the established data training set, to compress and decompress the certain data at the given structural granularity.

9. The system of claim 8, wherein the user policy goals include at least one of: a capacity usage, a write latency, Input/Output Operations per Second (IOPS), and a resource usage of the data.

10. The system of claim 8, wherein the compression parameters include at least one of: inline or background compression, synchronous or asynchronous compression, and batch or sub-batch compression.

11. The system of claim 8, wherein the data usage and workload characteristics include at least one of: a compression ratio, a data arrival and ingestion rate, and a data access rate.

12. The system of claim 8, wherein the training data set further utilizes a stream type, the stream type including at least one of:
a foreground data stream including compression of user data and checkpoint data; and
a background data stream including compression of garbage collection data and metadata.

13. The system of claim 8, wherein the processor exposes at least one of a plurality of compression application programming interfaces (APIs) to a read/write path of the certain data according to the selected compression parameter model.

14. The system of claim 8, wherein the compression parameter model includes at least one of: a multiple linear regression model and a multinomial logistic regression model.

15. A computer program product for cognitive compression with varying structural granularities in a NoSQL database, the computer program product comprising a non-transitory computer-readable storage medium having computer-readable program code portions stored therein, the computer-readable program code portions comprising:
an executable portion that establishes a data training set used to determine a timing and a given structural granularity at which to compress and decompress data stored within the NoSQL database; wherein the data training set includes received user policy goals, compression parameters, and metered feedback associated with data usage and workload characteristics; and
an executable portion that dynamically implements a compression parameter model in real-time for certain data of the data stored within the NoSQL database, selected according to the established data training set, to compress and decompress the certain data at the given structural granularity.

16. The computer program product of claim 15, wherein the user policy goals include at least one of: a capacity usage, a write latency, Input/Output Operations per Second (IOPS), and a resource usage of the data.

17. The computer program product of claim 15, wherein the compression parameters include at least one of: inline or background compression, synchronous or asynchronous compression, and batch or sub-batch compression.

18. The computer program product of claim 15, wherein the data usage and workload characteristics include at least one of: a compression ratio, a data arrival and ingestion rate, and a data access rate.

19. The computer program product of claim 15, wherein the training data set further utilizes a stream type, the stream type including at least one of:
a foreground data stream including compression of user data and checkpoint data; and
a background data stream including compression of garbage collection data and metadata.

20. The computer program product of claim 15, further including an executable portion that exposes at least one of a plurality of compression application programming interfaces (APIs) to a read/write path of the certain data according to the selected compression parameter model.

21. The computer program product of claim 15, wherein the compression parameter model includes at least one of: a multiple linear regression model and a multinomial logistic regression model.

* * * * *